(12) United States Patent
Itskovich (10) Patent No.: US 7,119,727 B2
(45) Date of Patent: Oct. 10, 2006

(54) ANALOG-TO-DIGITAL CONVERTER

(75) Inventor: Mikhail Itskovich, Columbia, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/972,993

(22) Filed: Oct. 25, 2004

(65) Prior Publication Data

US 2006/0087467 A1    Apr. 27, 2006

(51) Int. Cl.
*H03M 1/12*    (2006.01)
(52) U.S. Cl. .................................................. 341/155
(58) Field of Classification Search ................ 341/118, 341/120, 131, 139, 140, 141, 143, 155, 156, 341/126; 375/27, 28, 30
See application file for complete search history.

(56) References Cited

U.S. PATENT DOCUMENTS

| | | | |
|---|---|---|---|
| 4,875,048 A | 10/1989 | Shimizu et al. | |
| 5,070,332 A | 12/1991 | Kaller et al. | |
| 5,229,772 A * | 7/1993 | Hanlon | 341/172 |
| 5,245,343 A * | 9/1993 | Greenwood et al. | 341/143 |
| 5,272,481 A | 12/1993 | Sauer | |
| 5,727,023 A * | 3/1998 | Dent | 375/244 |
| 6,316,966 B1 | 11/2001 | Chang et al. | |
| 6,333,709 B1 | 12/2001 | Miyamoto | |
| 6,346,902 B1 | 2/2002 | Venes et al. | |
| 6,424,570 B1 | 7/2002 | Le et al. | |
| 6,515,606 B1 | 2/2003 | Lyden | |
| 6,617,991 B1 | 9/2003 | Kaul et al. | |
| 6,674,387 B1 * | 1/2004 | Ott | 341/155 |
| 6,674,388 B1 | 1/2004 | Mulder | |
| 6,700,523 B1 | 3/2004 | Konno | |
| 6,819,723 B1 * | 11/2004 | Wu et al. | 375/324 |

* cited by examiner

*Primary Examiner*—Brian Young
(74) *Attorney, Agent, or Firm*—Sawyer Law Group LLP (57) ABSTRACT

A system and method for implementing an analog-to-digital converter (ADC). The ADC includes a converter for generating a timed pulse based on an analog signal and a control signal. The ADC also includes a timing analyzer for generating a digital signal based on the timed pulse. According to the system and method disclosed herein, the present invention achieves a high sampling rate and low latency at low power.

7 Claims, 14 Drawing Sheets

FIG.1
100

| FIG.1/1 | FIG.1/2 |         |         |         |
|---------|---------|---------|---------|---------|
| FIG.1/1 | FIG.1/3 | FIG.1/5 | FIG.1/6 |         |
|         |         | FIG.1/5 | FIG.1/8 | FIG.1/9 |
|         |         | FIG.1/4 | FIG.1/7 |         |

ANALOG-TO-DIGITAL CONVERTER

FIELD OF THE INVENTION

The present invention relates to computers, and more particularly to a system and method for implementing an analog-to-digital converter.

BACKGROUND OF THE INVENTION

Analog-to-digital converters (ADCs) convert data from analog to digital form. ADCs are necessary in many applications. For example, information collected from analog phenomena such as sound and light can be digitized and made available for digital processing. Users of ADCs typically impose strict and sometimes conflicting requirements. For example, such requirements can include a high sampling rate, low latency, low power, low cost, etc.

One conventional solution is to use flash converters, which can provide fast conversion and lowest latency. However, a problem with conventional flash converters is that they achieve these objectives at a high cost. For example, conventional flash converters perform with low precision and consume very large amounts of power. Also, conventional flash converters have a limited input range, linearity problems, and difficulties in achieving high resolutions. Yet another drawback is that conventional flash converters require large silicon areas, which make them expensive to manufacture.

Successive approximation converters perform with higher precision and usually lower power than conventional flash converters. However, the conversion process of successive approximation converters provides an increased latency. Another problem with successive approximation converters is that the signal must be stored and processed for several cycles. This requires either accurate analog matching or decimation of input samples. Also, each converter must be designed for a specific set of applications and operating conditions, because successive approximation converters cannot be easily tuned.

Another conventional solution is using serial and delta-sigma converters. They can be very precise through a feedback error correction process. These architectures are very versatile, can easily adjust to surrounding conditions, and can be very accurate. However, a problem with these architectures is that the feedback process can take a long time. Consequently, the conversion rate is very slow. As a result, applications requiring medium and high sampling rates cannot use these architectures.

Accordingly, what is needed is an improved ADC. The ADC should achieve a high sampling rate and low latency, have low-power consumption, and should be simple, cost effective, and capable of being easily adapted to existing technology. The present invention addresses such a need.

SUMMARY OF THE INVENTION

An analog-to-digital converter (ADC) is disclosed. The ADC includes a converter for generating a timed pulse based on an analog signal and a control signal. The ADC also includes a timing analyzer for generating a digital signal based on the timed pulse. According to the system and method disclosed herein, the present invention achieves a high sampling rate and low latency at low power.

DETAILED DESCRIPTION OF THE INVENTION

The present invention relates to computers, and more particularly to a system and method for implementing an analog-to-digital converter. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiment shown, but is to be accorded the widest scope consistent with the principles and features described herein.

An ADC is disclosed. The ADC converts an analog signal into a timed pulse and then converts the timed pulse into a digital signal. As a result, the present invention provides analog-to-digital conversion at a high sampling rate with low latency at low power. To more particularly describe the features of the present invention, refer now to the following description in conjunction with the accompanying figures.

Figure 1:
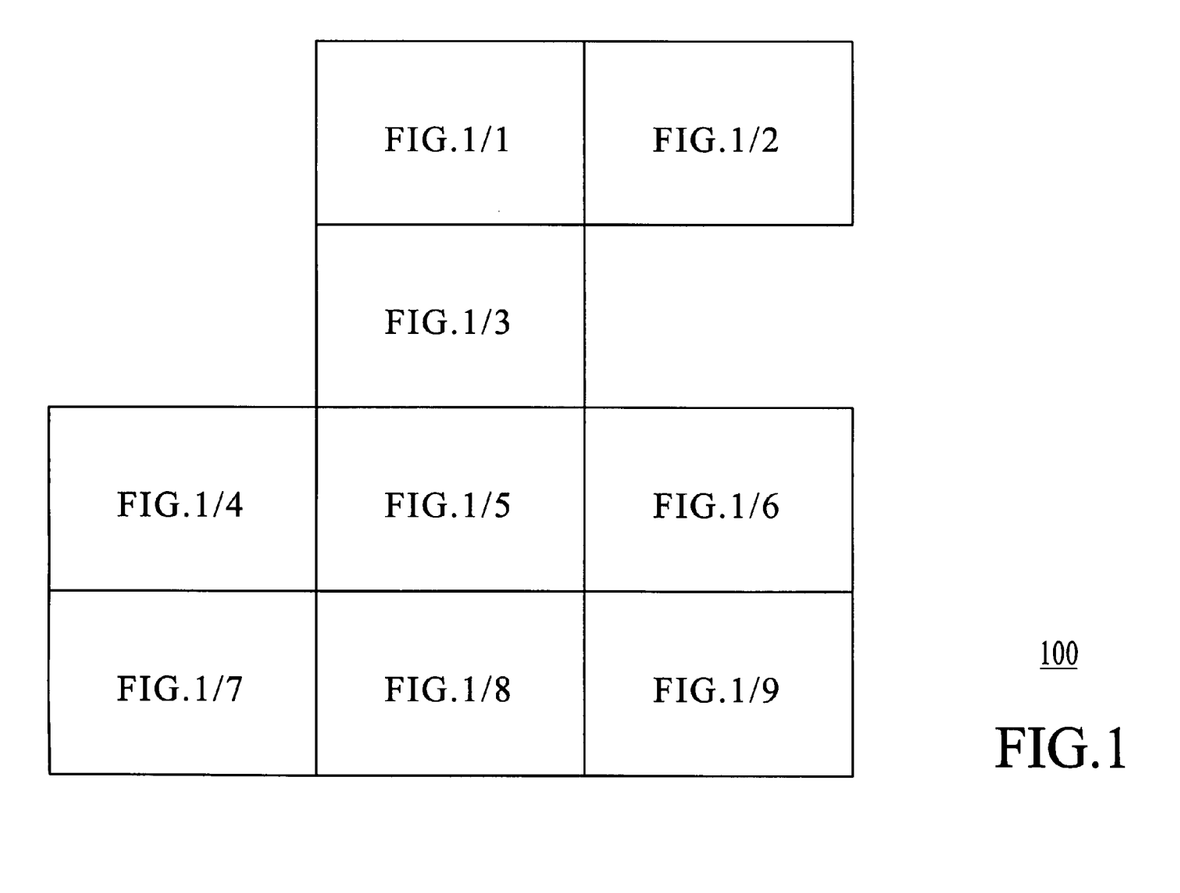
FIG. 1 is a block diagram of an ADC in accordance with the present invention.

FIG. 1 is a block diagram of an ADC 100 in accordance with the present invention. The ADC 100 includes a current source 102, a converter 104, a timing analyzer 106, a glitch filter 108, and a reset unit 110. In operation, generally, the ADC 100 first converts an analog voltage signal into a timed digital pulse. The ADC 100 then converts the timed digital pulse into a digital voltage signal. These steps are described in more detail below in conjunction with FIG. 2. In a specific embodiment, the ADC 100 is a compact low-power application specific cell (ASC) designed to digitize an analog voltage signal in one clock cycle up to 30 MS/s.

Figure 2:
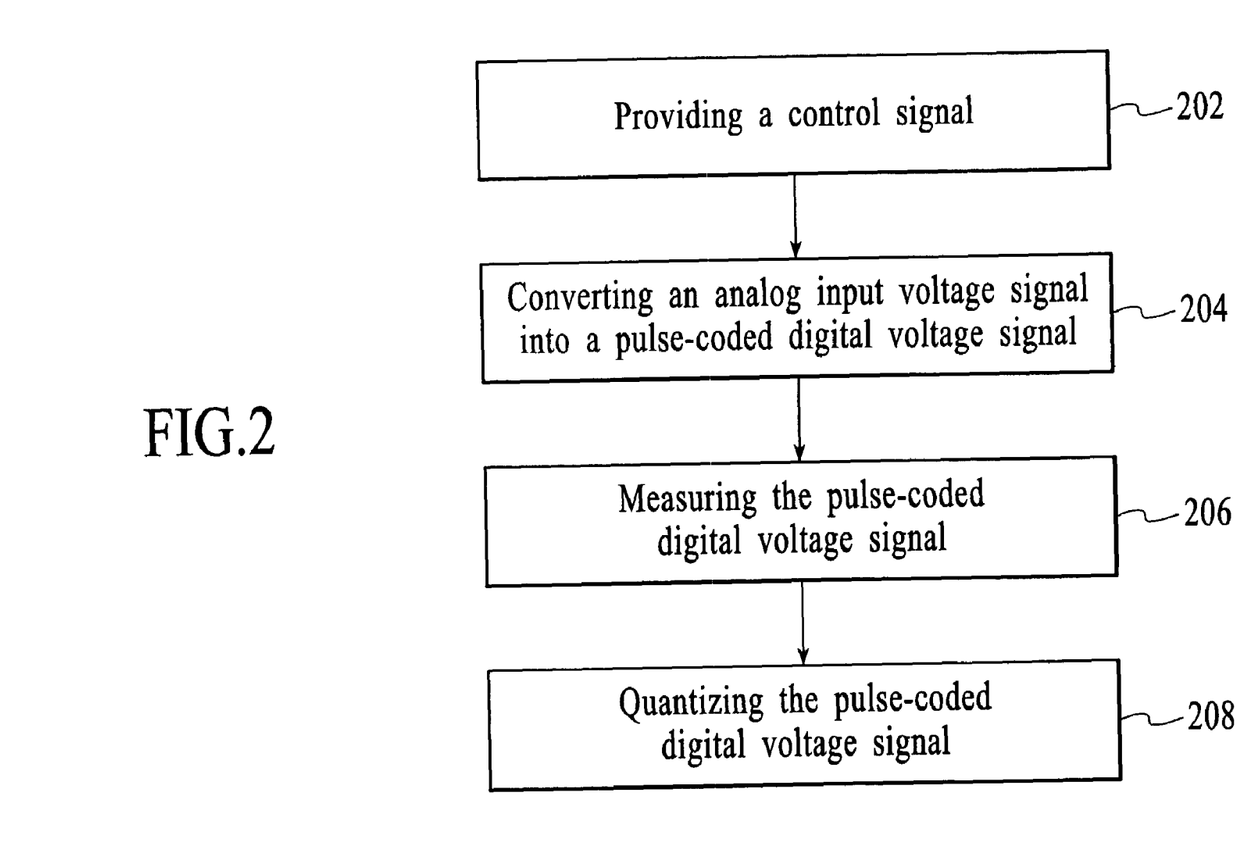
FIG. 2 is a flow chart showing a method for converting data from analog to digital form in accordance with the present invention.

FIG. 2 is a flow chart showing a method for converting data from analog to digital form in accordance with the present invention. Referring to both FIGS. 1 and 2 together, the current source 102 provides a control signal, in a step 202. In a specific embodiment, the control signal is a-pulse-coded analog current signal provided by 4-bit up/down counters 120, 122, and 124. Next, the converter 104 converts an input analog voltage signal into a pulse-coded digital voltage signal (i.e., timed pulse) based on the control signal and the input analog voltage signal, in a step 204.

Next, the timing analyzer 106 measures the pulse-coded digital voltage signal, in a step 206. Specifically, the pulse width of the pulse-coded digital voltage signal is measured by the timing analyzer 106. The timing analyzer 106 is a high-resolution timing analyzer.

Next, timing analyzer 106 quantizes the pulse-coded digital voltage signal, in a step 208. In a specific embodiment, the pulse-coded digital voltage signal is quantized into 8 bits. Also, the timing analyzer 106 performs each quantization in one clock cycle. As a result, a digital voltage value is captured with low latency, and with high linearity and precision. Also, the conversion process is broken down into smaller consecutive processes to lower power consumption.

The glitch filter 108 eliminates unwanted switching in the resulting digital voltage signal by resetting a reference clock in the voltage analyzer 106. The reset unit 110 triggers the glitch filter 108 each cycle of the reference clock.

Figure 3:
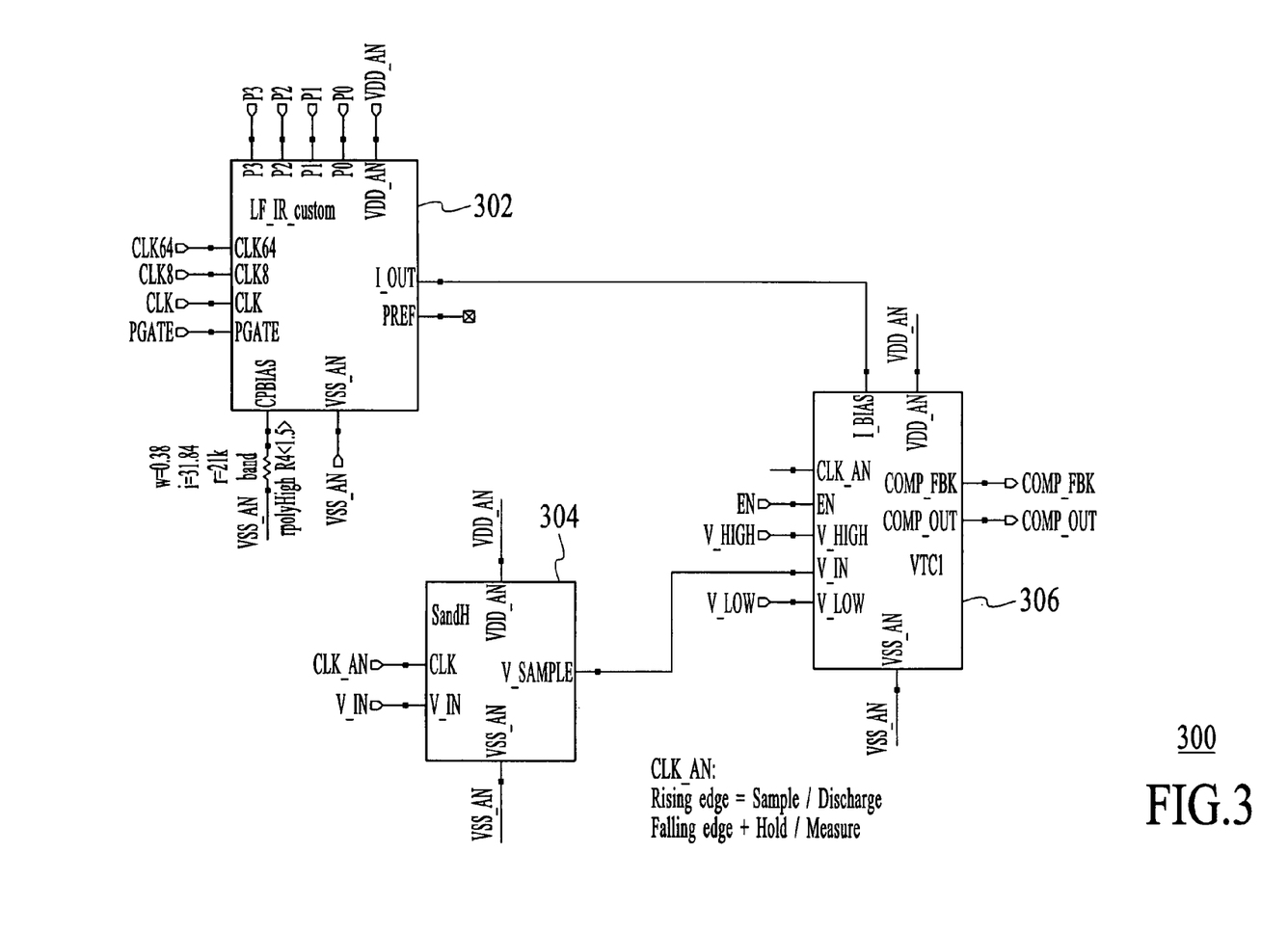
FIG. 3 is a block diagram of a converter, which can be used to implement the converter of FIG. 1, in accordance with the present invention.

FIG. 3 is a block diagram of a converter 300, which can be used to implement the converter 104 of FIG. 1, in accordance with the present invention. The converter 300 includes a loop filter 302, a sample and hold unit 304, and a voltage-to-time converter 306. The loop filter 302 is a current-based structure that attenuates the pulse-coded analog current signal (i.e., the control signal) provided by the current source 102 (FIG. 1). The loop filter outputs the pulse-coded analog current signal the voltage-to-time converter 306. The sample and hold unit 304 samples input analog voltage signals. The sampling occurs at the rate of the reference clock, which provides a high sampling rate. This also allows sampling closest to the Nyquist rate, eliminates drift due to input voltage variation, and results in lower latency.

The voltage-to-time converter 306 also aligns the input analog voltage signal with the pulse-coded analog current signal to provide a pulse-coded digital voltage signal. The voltage-to-time converter 306 outputs the pulse-coded digital voltage signal to the timing analyzer 106 (FIG. 1).

Figure 4:
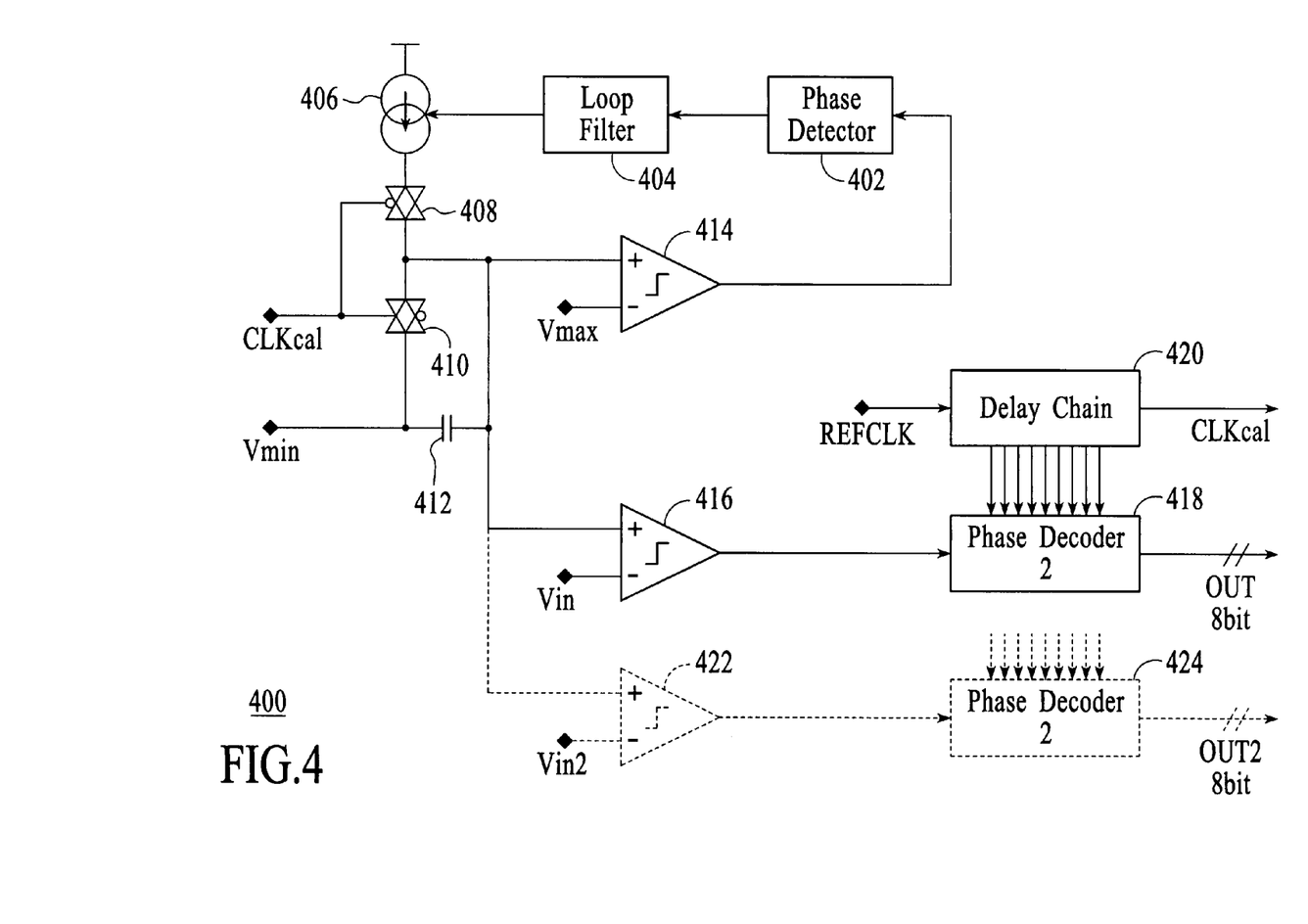
FIG. 4 is a block diagram of a converter, which can be used to implement the converter of FIG. 1, in accordance with another embodiment of the present invention.

FIG. 4 is a block diagram of a converter 400, which can be used to implement the converter 104 of FIG. 1, in accordance with another embodiment of the present invention. The converter 400 includes a phase detector 402, a loop filter 404, a current source 406, gates 408 and 410, a charge pump 412, comparators 414 and 416, a phase decoder 418, and a delay chain 420. Alternatively, the converter 400 can also include another comparator 422 and another phase decoder 424.

The reference delay chain 420 has 256 equal delay elements and has a fixed maximum timing range Tmax. The specific number of delay elements will vary depending on the specific application. This maximum range Tmax is represented as a clock pulse CLKcal. The clock pulse CLKcal is used to turn on the current source 406 using the gates 408 and 410. The current source 406 charges the charge pump 412 to a voltage, which is a function of capacitance, current, and pulse width of the current. In a specific embodiment, the charge pump 412 is a linear capacitor. Also, the pulse width and the capacitance are constant.

The phase detector 402 and the loop filter 404 tune the current source 406 such that the charge pump 412 charges to exactly Vmax during each clock pulse CLKcal. Accordingly, the voltage range of the input analog voltage signal directly correlates to the timing range of the delay chain. As a result, the charge pump 412 reaches Vmax at exactly time Tmax.

Figure 5:
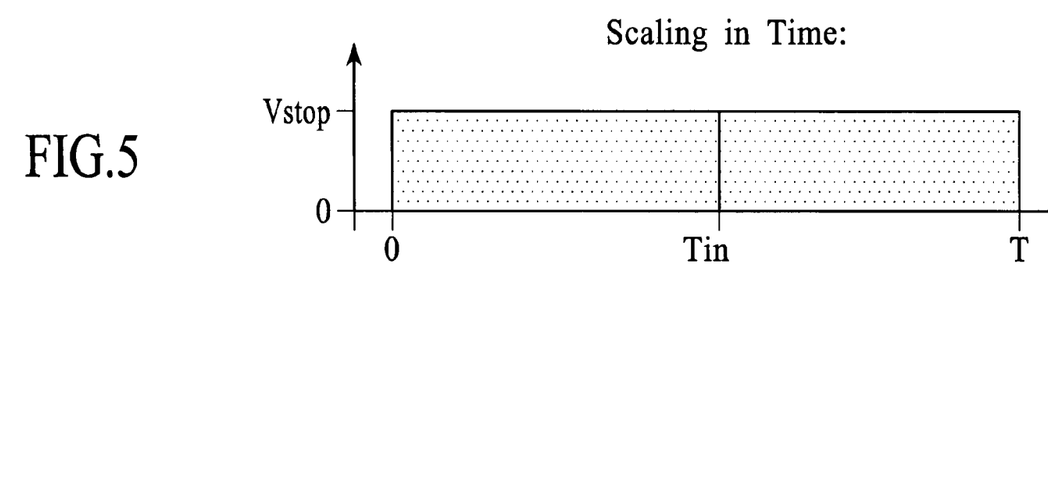
FIG. 5 is a chart showing a resulting time scale of the converter of FIG. 4 in accordance with the present invention.

FIG. 5 is a chart showing a resulting time scale of the converter 400 of FIG. 4 in accordance with the present invention. The converter 400 calibration forces the equivalence: Vin/Vmax=Tin/Tmax, where Tin is the time period required to charge up the charge pump 412 (FIG. 4) to the input analog voltage Vin. Vmax is the voltage resulting from charging up the charge pump for the maximum timing range Tmax.

The input analog voltage Vin can be measured by the comparator 416, which triggers when the voltage pump 412 voltage reaches the level of the input voltage Vin, at which point a timed pulse of the time period Tin is created.

The timed pulse is fed into the phase decoder 402, which counts the number of timing elements contained in the time period Tin. The output count represents the ratio of Tin/Tmax and Vin/Vmax, which is the 8 bit digital representation of the amplitude of the input voltage Vin.

The converter 400 enables the ADC 100 (FIG. 1) to be self-correcting, as the output from the charge pump 412 is fed back to the phase detector 402 and the loop filter 404. The ADC 100 is constantly tuned to conform to input parameters and to maintain alignment between internal stages through process and condition variations. The ADC 100 can also maintain ADC accuracy based on user selected input range, sampling rate, process variation, temperature variation, and supply voltage level.

Figure 6:
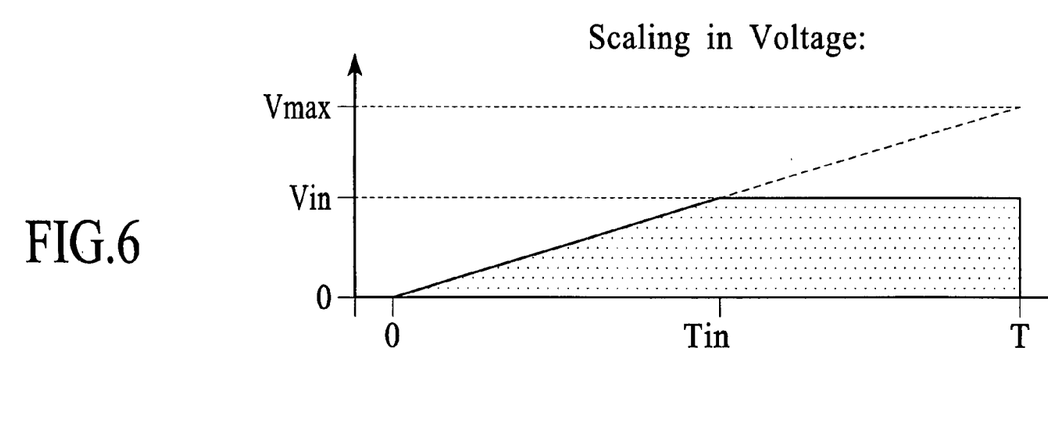
FIG. 6 is a chart showing a resulting voltage scale of the converter of FIG. 4 in accordance with the present invention.

FIG. 6 is a chart showing a resulting voltage scale of the converter 400 of FIG. 4 in accordance with the present invention. More input voltages can be measured by adding the additional comparator 422 and the phase decoder 424 as shown in FIG. 5 by the dashed lines.

According to the system and method disclosed herein, the present invention provides numerous benefits. For example, it provides the high-speed functionality of a flash ADC, the precision of a successive approximation ADC, and the low area and power consumption characteristics of a serial ADC. This targets applications that require low latency, a medium sampling rate, a high precision and a small voltage range. Embodiments of the present invention also achieve a high sampling rate and low latency at low power. Embodiments of the present invention also maintain conversion accuracy for all conditions.

A system and method in accordance with the present invention for converting data from analog to digital form has been disclosed. The system and method converts an analog signal into a timed pulse and then converts the timed pulse into a digital signal. As a result, the present invention provides analog-to-digital conversion at a high sampling rate with low latency at low power.

The present invention has been described in accordance with the embodiments shown. One of ordinary skill in the art will readily recognize that there could be variations to the embodiments, and that any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

What is claimed is:

1. An analog-to-digital converter (ADC) comprising:
  a converter for generating a timed pulse based on an analog signal and a control signal, wherein the converter further comprises:
  a phase detector;
  a loop filter coupled to the phase detector;
  a charge pump coupled to the loop filter;

at least one comparator coupled to the charge pump;
a phase decoder; and
a current source for generating the control signal; and
a timing analyzer for generating a digital signal based on the timed pulse.

2. The ADC of claim 1 wherein the loop filter and the phase detector tune the control signal such that the charge pump charges to a maximum voltage during each pulse of a clock.

3. An analog-to-digital converter (ADC) comprising:
a converter for generating a timed pulse based on an analog signal and a control signal; and
a timing analyzer for generating a digital signal based on the timed pulse, wherein the converter comprises:
a current source for generating the control signal;
a delay chain for regulating the current source, wherein the delay chain provides a timing range, and wherein the digital signal correlates with the timing range;
a phase detector;
a loop filter coupled to the phase detector;
a charge pump coupled to the loop filter;
at least one comparator coupled to the charge pump; and
a phase decoder.

4. The ADC of claim 3 wherein the loop filter and the phase detector tune the control signal such that the charge pump charges to a maximum voltage during each pulse of a clock.

5. The ADC of claim 3 wherein the converter is self-correcting.

6. A method for converting data from analog to digital form, the method comprising:
receiving an analog signal;
converting the analog signal into a timed pulse; and
generating a digital signal based on the timed pulse, wherein the digital signal is based on a ratio between Tin/Tmax and Vin/Vmax, wherein Tin is the time period required to charge up a charge pump to Vin, wherein Tmax is a maximum timing range, wherein Vin is the amplitude of the analog signal, and wherein Vmax is the voltage resulting from charging up the charge pump for the maximum timing range Tmax.

7. A computer readable medium containing program instructions for converting data from analog to digital form, the program instructions which when executed by a computer system cause the computer system to execute a method comprising:
receiving an analog signal;
converting the analog signal into a timed pulse; and
generating a digital signal based on the timed pulse, wherein the digital signal is based on a ratio between Tin/Tmax and Vin/Vmax, wherein Tin is the time period required to charge up a charge pump to Vin, wherein Tmax is a maximum timing range, wherein Vin is the amplitude of the analog signal, and wherein Vmax is the voltage resulting from charging up the charge pump for the maximum timing range Tmax.

* * * * *